(12) United States Patent
Borrelli et al.

(10) Patent No.: US 10,866,367 B2
(45) Date of Patent: Dec. 15, 2020

(54) WAFER-LEVEL LENSES FOR FIBER OPTIC CONNECTORS AND METHODS FOR MAKING THE SAME

(71) Applicant: Corning Research & Development Corporation, Corning, NY (US)

(72) Inventors: Nicholas Francis Borrelli, Elmira, NY (US); Andrey Kobyakov, Painted Post, NY (US); Joseph Francis Schroeder, III, Lindley, NY (US); Mark Owen Weller, Painted Post, NY (US)

(73) Assignee: Corning Research & Development Corporation, Corning, NY (US)

( * ) Notice: Subject to any disclaimer, the term of this patent is extended or adjusted under 35 U.S.C. 154(b) by 0 days.

(21) Appl. No.: 16/506,121

(22) Filed: Jul. 9, 2019

(65) Prior Publication Data

US 2020/0018906 A1    Jan. 16, 2020

Related U.S. Application Data

(60) Provisional application No. 62/695,896, filed on Jul. 10, 2018.

(51) Int. Cl.
*G02B 6/38* (2006.01)
*G03F 7/00* (2006.01)

(52) U.S. Cl.
CPC ......... *G02B 6/3853* (2013.01); *G02B 6/3854* (2013.01); *G03F 7/0005* (2013.01)

(58) Field of Classification Search
CPC .... G02B 6/3853; G02B 6/3854; G03F 7/0005
See application file for complete search history.

(56) References Cited

U.S. PATENT DOCUMENTS

| | | | | |
|---|---|---|---|---|
| 5,135,590 A * | 8/1992 | Basavanhally | ........... | G02B 6/32 156/154 |
| 6,328,482 B1 * | 12/2001 | Jian | ........................ | G02B 6/423 385/33 |
| 6,421,123 B1 * | 7/2002 | Shiraishi | ................. | G03F 7/701 356/399 |
| 6,927,861 B2 * | 8/2005 | Zhou | .................... | G02B 6/4224 156/292 |

(Continued)

OTHER PUBLICATIONS

Borrelli et al; "Photolytic Technique for Producing Microlenses in Photosensitive Glass"; J. Appl. Phys. vol. 24, 25202525 (1985).

(Continued)

*Primary Examiner* — Sung H Pak
(74) *Attorney, Agent, or Firm* — Michael E. Carroll, Jr.

(57) ABSTRACT

A method for forming lenses for a fiber optic connector includes forming a mask on a photosensitive glass, the mask defining a plurality of covered portions of the photosensitive glass and a plurality of open portions of the photosensitive glass that are positioned between the plurality of covered portions, exposing the photosensitive glass and the mask to electromagnetic energy, removing the mask from the photosensitive glass, forming wafer-level lenses at the plurality of covered portions of the photosensitive glass by exposing the photosensitive glass to thermal energy, and applying an anti-reflective coating to an upper surface of the photosensitive glass.

22 Claims, 7 Drawing Sheets

(56) References Cited

U.S. PATENT DOCUMENTS

| | | | |
|---|---|---|---|
| 7,027,687 B2 * | 4/2006 | Kishima | G02B 6/425 385/31 |
| 7,029,806 B2 * | 4/2006 | Dannoux | G02B 6/3664 385/137 |
| 7,241,559 B2 | 7/2007 | Borrelli et al. | |
| RE40,416 E * | 7/2008 | Jian | G02B 6/423 385/33 |
| 9,343,450 B2 | 5/2016 | Shastri et al. | |
| 9,354,404 B2 | 5/2016 | Ql et al. | |
| 2016/0139339 A1 | 5/2016 | Sasaki et al. | |
| 2016/0161684 A1 | 6/2016 | Kachru et al. | |

OTHER PUBLICATIONS

Borrelli; "Microoptics Technology" ; 2nd Ed. Marcel Dekker 2005; 40 Pages.

Childers et al; "New, Single-Mode, Multi-Fiber, Expanded Beam, Passive Optical Interconnect" ; Proc. SPIE vol. 8991, 89910J (2014).

Childers et al; "Next Generation, High Density, Low Cost, Multimode Optical Backplane Interconnect" ; Proc. of SPIE vol. 8267, 82670O (2012).

Marin et al; "Mechanical Performance of Physical-Contact, Multi-Fiber Optical Connectors: Finite Element Analysis and Semi-Analytical Model" ; Opt. Fiber Technol. 30 (2016) 4864.

Takaya et al; "Design and Performance of Very-High-Density 60-Fiber Connectors" ; IEEE J. Lightwave Technol. 21 (6) (2003) 15491556.

* cited by examiner

WAFER-LEVEL LENSES FOR FIBER OPTIC CONNECTORS AND METHODS FOR MAKING THE SAME

RELATED APPLICATIONS

This application claims the benefit of priority under 35 U.S.C. § 119 of U.S. Provisional Application Ser. No. 62/695,896 filed on Jul. 10, 2018 the content of which is relied upon and incorporated herein by reference in its entirety.

FIELD

This disclosure relates to wafer-level lenses for fiber optic connectors and methods for making wafer-level lenses for fiber optic connectors.

TECHNICAL BACKGROUND

Communication networks are used to transport a variety of signals such as voice, video, data transmission, and the like. Traditional communication networks use copper wires in cables for transporting information and data. However, copper cables have drawbacks because they are large, heavy, and can only transmit a relatively limited amount of data. On the other hand, an optical fiber is capable of transmitting an extremely large amount of bandwidth compared with a copper conductor. Moreover, an optical fiber cable is much lighter and smaller compared with a copper cable having the same bandwidth capacity. Consequently, optical fiber cables replaced most of the copper cables in long-haul communication network links, thereby providing greater bandwidth capacity for long-haul links. However, many of these long-haul links have bandwidth capacity that is not being used. This is due in part to communication networks that use copper cables for distribution and/or drop links on the subscriber side of the central office. In other words, subscribers have a limited amount of available bandwidth due to the constraints of copper cables in the communication network. Stated another way, the copper cables are a bottleneck that inhibit the subscriber from utilizing the relatively high-bandwidth capacity of the long-hauls links.

As optical fibers are deployed deeper into communication networks, subscribers will have access to increased bandwidth. But there are certain obstacles that make it challenging and/or expensive to route optical fibers/optical cables deeper into the communication network, i.e., closer to the subscriber. For instance, making a suitable optical connection between optical fibers is much more difficult than making an electrical connection between copper wires. This is because optical connections require special tools and equipment, highly trained craftsman, along with precision components. Additionally, as the communication network pushes toward subscribers, the communication network requires more connections, which compounds the difficulties of providing optical fibers to the premises of the subscriber.

One common way of connecting optical fibers is by physically contacting ferrule-based fibers to one another. Some connectors may include multiple optical fibers such that multiple optical fibers can be connected to one another simultaneously. However, to ensure proper physical contact between all of the optical fibers in corresponding connectors, strict manufacturing tolerances on the positioning of each of the optical fibers within the connectors must be maintained, which may increase manufacturing costs. Furthermore, variability in the position of each of the optical fibers may increase the force required to be applied to the corresponding connectors to ensure proper connection between associated optical fibers, making connection difficult.

Accordingly, a need exists for alternative apparatuses for optically coupling optical connectors and methods for making the same.

SUMMARY

In one embodiment, a method for forming lenses for a fiber optic connector includes forming a mask on a photosensitive glass, the mask defining a plurality of covered portions of the photosensitive glass and a plurality of open portions of the photosensitive glass that are positioned between the plurality of covered portions, exposing the photosensitive glass and the mask to electromagnetic energy, removing the mask from the photosensitive glass, forming wafer-level lenses at the plurality of covered portions of the photosensitive glass by exposing the photosensitive glass to thermal energy, and applying an anti-reflective coating to an upper surface of the photosensitive glass.

In another embodiment, a method for aligning a ferrule with wafer-level lenses, the method includes forming a mask on a photosensitive glass, the mask defining a plurality of covered portions of the photosensitive glass, and a plurality of open portions of the photosensitive glass positioned between the plurality of covered portions, exposing the photosensitive glass and the mask to electromagnetic energy, removing the mask from the photosensitive glass, forming wafer-level lenses at the plurality of covered portions of the photosensitive glass by exposing the photosensitive glass to thermal energy, positioning the ferrule adjacent to the wafer-level lenses, the ferrule including a plurality of apertures corresponding to the wafer-level lenses, passing a light signal through the plurality of apertures in the ferrule and the wafer-level lenses, detecting a light output through the wafer-level lenses, and moving the ferrule based on the detected light output through the wafer-level lenses.

In yet another embodiment, a wafer-level lens assembly including a ferrule including a plurality of apertures extending through a thickness of the ferrule, a plurality of optical fibers positioned in and extending through the plurality of apertures of the ferrule, and a photosensitive glass including wafer-level lenses optically coupled to the plurality of optical fibers.

It is to be understood that both the foregoing general description and the following detailed description are merely exemplary, and are intended to provide an overview or framework to understanding the nature and character of the claimed subject matter. The accompanying drawings are included to provide a further understanding and are incorporated in and constitute a part of this specification. The drawings illustrate one or more embodiment(s), and together with the description, serve to explain principles and operation of the various embodiments.

BRIEF DESCRIPTION OF THE DRAWINGS

FIG. 3 schematically depicts the photosensitive glass of FIG. 2 after the application of electromagnetic energy and thermal energy, according to one or more embodiments shown and described herein;

DETAILED DESCRIPTION

Reference will now be made in detail to exemplary embodiments which are illustrated in the accompanying drawings. Whenever possible, the same reference will be used throughout the drawings to refer to the same or like parts. The components in the drawings are not necessarily to scale, emphasis instead being placed upon illustrating the principles of the exemplary embodiments.

Numerical values, including endpoints of ranges, can be expressed herein as approximations preceded by the term "about," "approximately," or the like. In such cases, other embodiments include the particular numerical values. Regardless of whether a numerical value is expressed as an approximation, two embodiments are included in this disclosure: one expressed as an approximation, and another not expressed as an approximation. It will be further understood that an endpoint of each range is significant both in relation to another endpoint, and independently of another endpoint.

Embodiments described herein are directed to wafer-level lenses for use in fiber optic connectors. The wafer-level lenses are formed on a photosensitive glass by selectively exposing portions of the photosensitive glass to electromagnetic energy and thermal energy. In embodiments, an anti-reflective coating may be applied to the wafer-level lenses to reduce Fresnel reflection, and reduce signal loss across the wafer-level lenses. A ferrule including a plurality of apertures for holding a plurality of optical fibers is coupled to the wafer-level lenses. The plurality of optical fibers may be aligned with the wafer-level lenses such that each of the optical fibers is aligned with a corresponding wafer-level lens simultaneously. These and other embodiments are described in greater detail herein.

Figure 1:
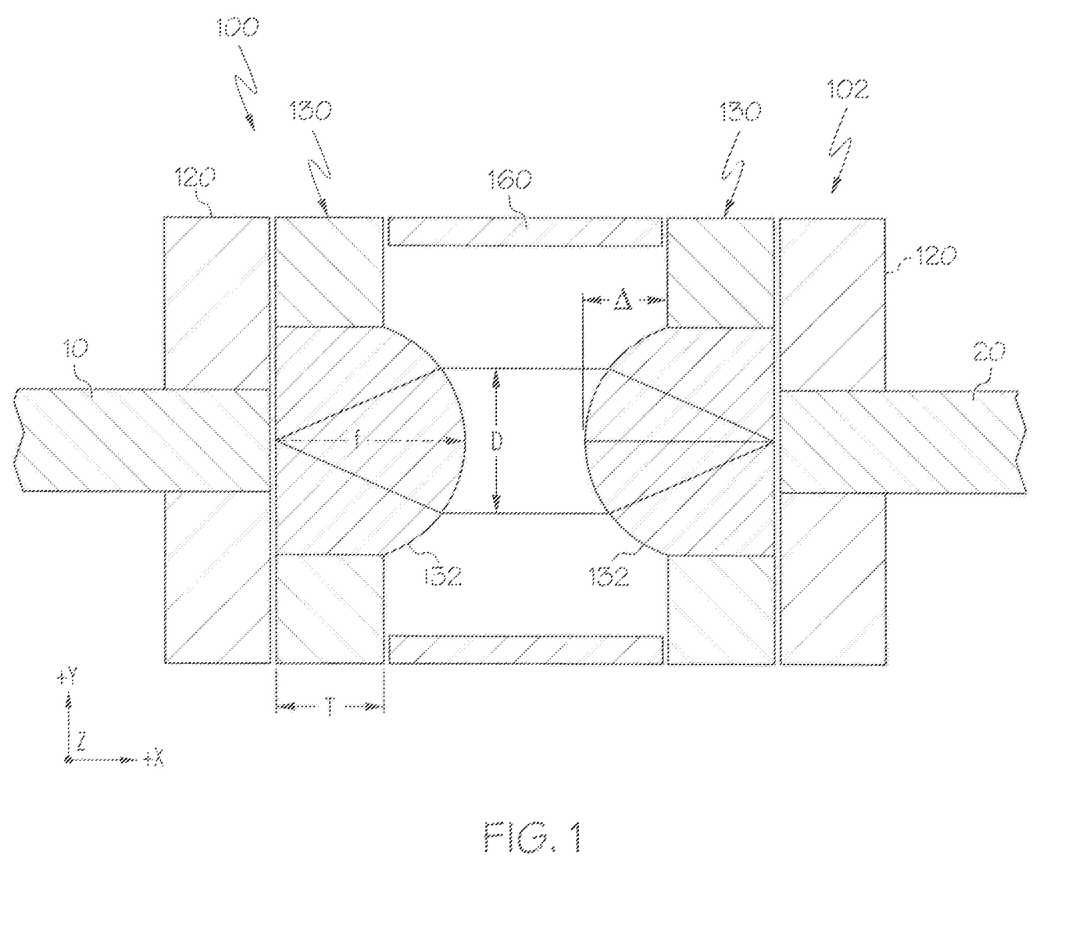
FIG. 1 schematically depicts a cross-section of a pair of fiber optic connectors including lenses optically coupled to one another, according to one or more embodiments shown and described herein.

Referring initially to FIG. 1, a cross-section of a first fiber optic connector 100 coupled to a second fiber optic connector 102 is schematically depicted. The first fiber optic connector 100 and the second fiber optic connector 102 are separated from one another by a spacer 160 and are optically coupled to one another. The first fiber optic connector 100 and the second fiber optic connector 102 each include a ferrule 120 and a photosensitive glass 130 coupled to the ferrule 120. The photosensitive glass 130 of the first fiber optic connector 100 and the second fiber optic connector 102 each include a lens 132 that extends outward from the photosensitive glass 130 by a sag height Δ. The first fiber optic connector 100 includes a first optical fiber 10 extending through the ferrule 120 and optically coupled to the lens 132 of the first fiber optic connector 100. The second fiber optic connector 102 includes a second optical fiber 20 extending through the ferrule 120 and optically coupled to the lens 132 of the second fiber optic connector 102. A focal length f of the lenses 132 is generally defined by a diameter D of the lenses 132 and the a sag height Δ of the lenses, such that the focal length f is defined by the equation:

$$f=D^2/4\Delta$$

The lenses 132 of the first fiber optic connector 100 and the second fiber optic connector 102 are optically coupled to one another such that optical signals may be transmitted from the first optical fiber 10 to the second optical fiber 20 through the lenses 132.

In embodiments, the lenses 132 of the first fiber optic connector 100 and the second fiber optic connector 102 are formed on the photosensitive glass 130 at a wafer-level, as described below. Wafer-level lenses 132 may then be diced as desired, either into individual lenses 132 or pluralities of lenses 132.

Figure 2:
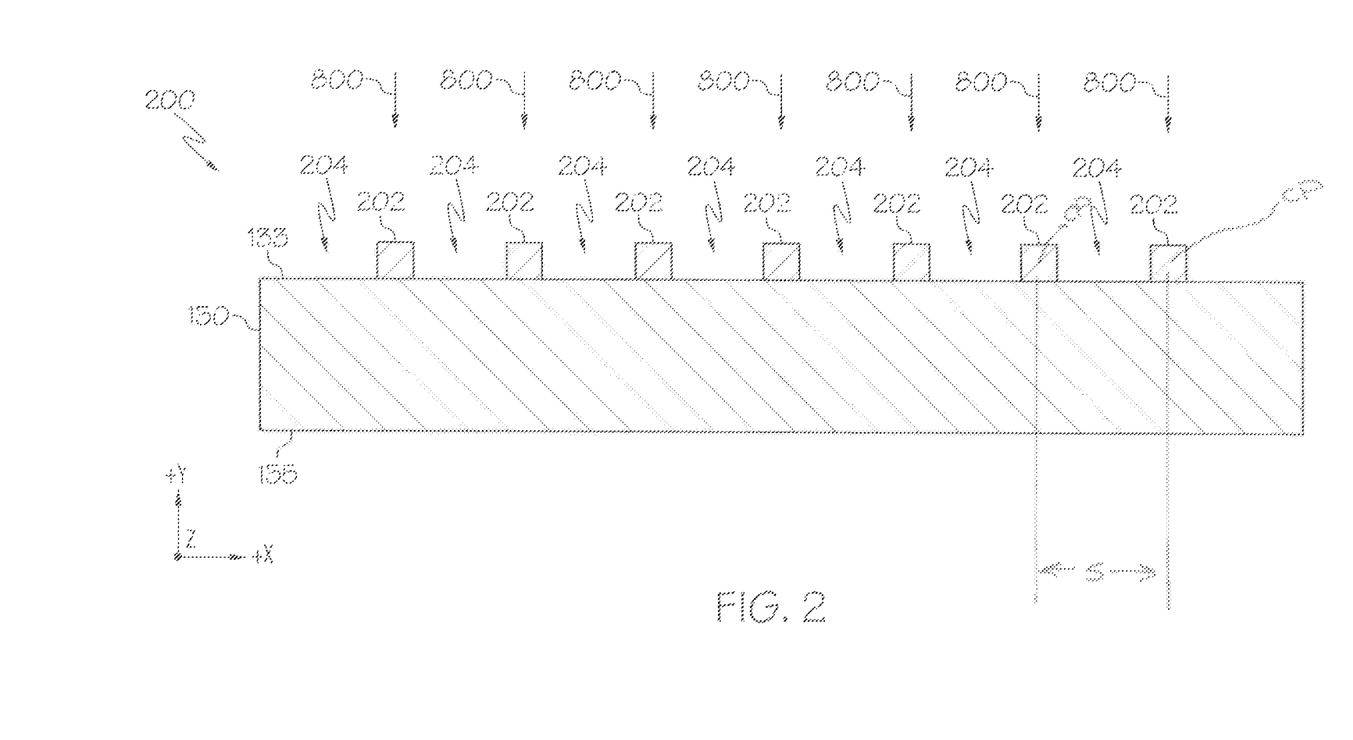
FIG. 2 schematically depicts a photosensitive glass for forming wafer-level lenses with a mask positioned on the photosensitive glass, according to one or more embodiments shown and described herein.

Referring to FIG. 2, a cross-section of the photosensitive glass 130 for forming wafer-level lenses is schematically depicted. As used herein, the term photosensitive means that upon the application of electromagnetic energy, regions the glass exposed to the electromagnetic energy may crystallize such that the irradiated regions may react differently to the application of thermal energy that regions not irradiated by the electromagnetic energy. In embodiments, the photosensitive glass 130 may include a photonucleable, crystallizable lithium-silicate glass plate that contains a predetermined amount of a photosensitive agent (e.g., silver, gold or a combination thereof). Exemplary silicate glass compositions of the preferred photosensitive glass 130 are described in greater detail below with respect to Tables 1 and 2A-2B below. In embodiments, the photosensitive glass 130 may include photosensitive glass as described in U.S. Pat. No. 7,241,559, assigned to Corning Inc., the contents of which are hereby incorporated by reference in its entirety.

A mask 202 is initially applied to an upper surface 133 of the photosensitive glass 130. In the embodiment depicted in FIG. 3, the mask 202 defines a plurality of open portions 204 of the photosensitive glass 130 that are positioned between portions of the photosensitive glass that are covered by the mask 202. The mask 202 may be formed of any suitable material to absorb and/or reflect electromagnetic energy such that the portions of the photosensitive glass 130 covered by the mask 202 are not affected by the application of electromagnetic energy.

With the mask 202 applied, electromagnetic energy 800 is applied to the photosensitive glass 130, as depicted in FIG. 3. In embodiments, electromagnetic energy 800 may be generated by an electromagnetic source, such as an ultraviolet (UV) laser, a contoured laser technology (CLT) laser, or the like which may crystallize the photosensitive glass 130 at the open portions 204. In one embodiment, the electromagnetic energy 800 comprises ultraviolet light with wavelengths between 240 nanometers (nm) and 400 nm, inclusive of the endpoints. In another embodiment, the electromagnetic energy 800 comprises ultraviolet light with wavelengths between 300 nm and 350 nm, inclusive of the endpoints. While particular wavelengths of ultraviolet light are referenced herein, it should be understood that any electromagnetic energy 800 suitable to induce crystallization of the open portions 204 may be applied to the photosensitive glass 130. The crystallization of the open portions 204 of the photosensitive glass 130 increases a density of the open portions 204 as compared to the density of the portions of the photosensitive glass 130 covered by the mask 202, such that the open portions 204 react differently to the application of thermal energy. Furthermore, in some embodiments, the portions of the photosensitive glass 130 covered by the mask 202 may remain generally colorless, while the open portions 204 may change color upon the application of the electromagnetic energy 800. For example, in some embodiments, the photosensitive glass 130 at the open portions 204 may become opaque upon the application of the electromagnetic energy 800.

Referring to FIG. 3, the mask 202 is removed, and the photosensitive glass 130 is heated, such as by the application of thermal energy. As described above, the open portions 204 (FIG. 2) of the photosensitive glass 130 may have a higher density than the portions of the photosensitive glass 130 that were covered by the mask 202 (FIG. 2). Accordingly, the photosensitive glass 130 comprises high-density portions 134 that correspond to the open portions 204 (FIG. 2) of the photosensitive glass 130 that were exposed to electromagnetic energy 800 (FIG. 2). As the photosensitive glass 130 is heated, the high-density portions 134 of the photosensitive glass 130 expand and compress the less dense portions of the photosensitive glass 130. The less dense portions of the photosensitive glass 130 are compressed, such that the less dense portions of the photosensitive glass 130 expand above the upper surface 133 and the lower surface 135 of the photosensitive glass 130 to form a plurality of wafer-level lenses 132. In particular, the less dense portions of the photosensitive glass 130 may expand such that the wafer-level lenses 132 extend above the upper surface 133 of the photosensitive glass by the sag height $\Delta$ evaluated between a top of the wafer-level lenses 132 and the upper surface 133 of the photosensitive glass 130. The sag height $\Delta$ may have any suitable value, and generally speaking smaller sag heights $\Delta$ are desired such as 40 micrometers or less. In some embodiments, the sag height $\Delta$ is between 36.8 micrometers ($\mu$m) and 187 $\mu$m, inclusive of the endpoints. The sag height $\Delta$ contributes to the focal length of the wafer-level lenses 132, as described above.

As depicted in FIG. 2, there is a spacing S of the plurality of the covered portions CP of the mask 202. The spacing S of the covered portions CP may have any suitable geometry such as a linear array, a multi-row array, a circular array or other configurations as desired for the wafer-level lenses 132 on the photosensitive glass 130. As shown in FIG. 3, the spacing of the wafer-level lenses 132 are formed at a lens-spacing LS. However, creating the wafer-level lenses 132 in the photosensitive glass 130 may cause shrinkage in the photosensitive glass 130, thereby resulting in wafer-level lenses 132 having a smaller spacing than the spacing S of the covered portions CP provided by mask 202.

Consequently, the spacing S of the covered portions CP on mask 202 must be adjusted or to have a larger spacing to arrive at the desired lens-spacing LS (e.g., S>LS). By way of explanation, if the desired lens-spacing LS for the wafer-level lenses is 250 microns, then the spacing S for the covered portions CP must be larger than 250 microns to accommodate for the shrinkage in the photosensitive glass 130. The methods disclosed herein allows the lens-spacing LS is controlled to within 0.3 micrometers or less of the desired spacing. In other embodiments, the lens-spacing LS is controlled to within 0.1 micrometers or less of the desired spacing. Thus, precision spacing of the wafer-level lenses 132 on the photosensitive glass 130 may be controlled to the desired lens-spacing by adjusting the spacing S of the covered portion CP accordingly on the mask 202.

In some embodiments, the photosensitive glass 130 may be positioned in a furnace to apply the thermal energy to form the wafer-level lenses 132. For example, in one embodiment, the photosensitive glass 130 may be heated at 615° Celsius (C) for 1 hour. In other embodiments, the photosensitive glass may be heated at any suitable temperature by any suitable method to form the wafer-level lenses 132.

Figure 4:
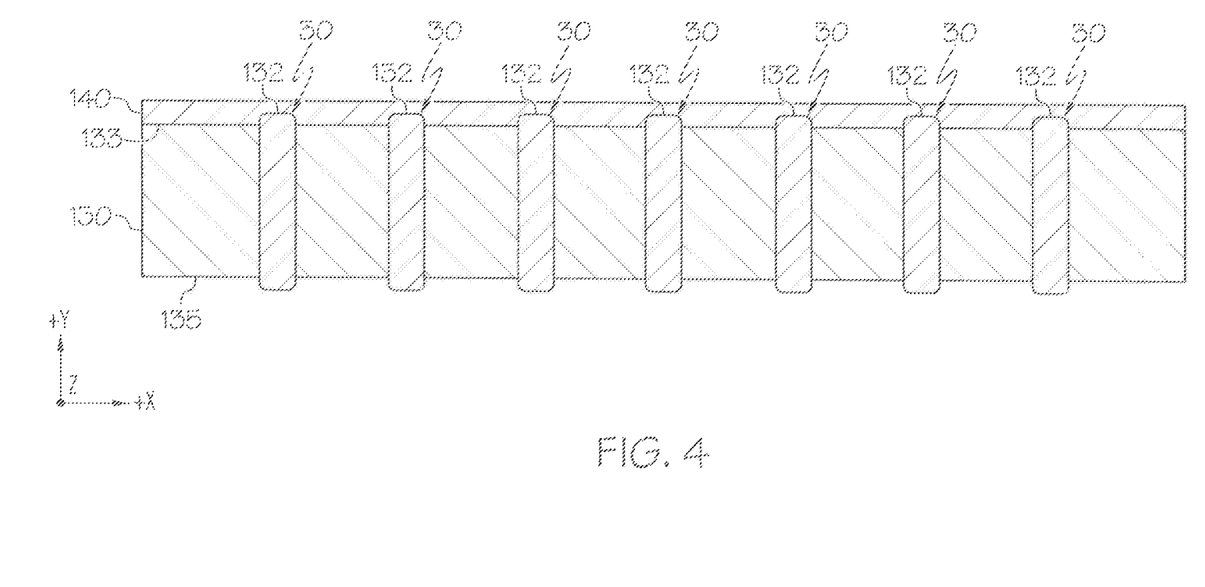
FIG. 4 schematically depicts the photosensitive glass of FIG. 3 with an anti-reflective coating applied to an upper surface of the photosensitive glass, according to one or more embodiments shown and described herein.

Referring now to FIG. 4, an anti-reflective coating 140 may be applied to the photosensitive glass 130 in some embodiments. In particular, the anti-reflective coating 140 is applied to the upper surface 133 of the photosensitive glass 130, and over a lens end 30 of the plurality of wafer-level lenses 132 extending above the upper surface 133 of the photosensitive glass 130. As depicted, the anti-reflective coating 140 may be applied as a layer over all of the wafer-level lenses 132 of the photosensitive glass 130. Because the lenses 132 are fabricated at a wafer-level (i.e., with multiple lenses on the photosensitive glass 130), the anti-reflective coating 140 may be applied to numerous wafer-level lenses 132 at once. By applying the anti-reflective coating 140 to numerous wafer-level lenses 132 at the same time, the anti-reflective coating 140 may be accurately applied at a consistent thickness (evaluated in they y-direction as depicted in FIG. 4) and in a cost-effective manner. Anti-reflective coating may reduce signal loss due to Fresnel reflection between optically coupled lenses. However, conventional lenses for use in fiber optic connectors may generally have a diameter less than about 0.5 millimeters (mm). Because of the relatively small size of conventional lenses, the accurate application of an anti-reflective coating to individual lenses is difficult to achieve and is cost-prohibitive. By contrast, by scaling the production of lenses as wafer-level lenses 132 on a photosensitive glass 130, the anti-reflective coating 140 may be efficiently and accurately applied.

In embodiments, the anti-reflective coating 140 may include any suitable coating, such as an index-matching coating, a single-layer interference coating, a multi-layer interference coating, an absorbing coating, or the like, and may be formed of any suitable material, including but not limited to, magnesium fluoride, fluoropolymers, silica, titanium nitride, niobium nitride, or any combination thereof.

Figure 5:
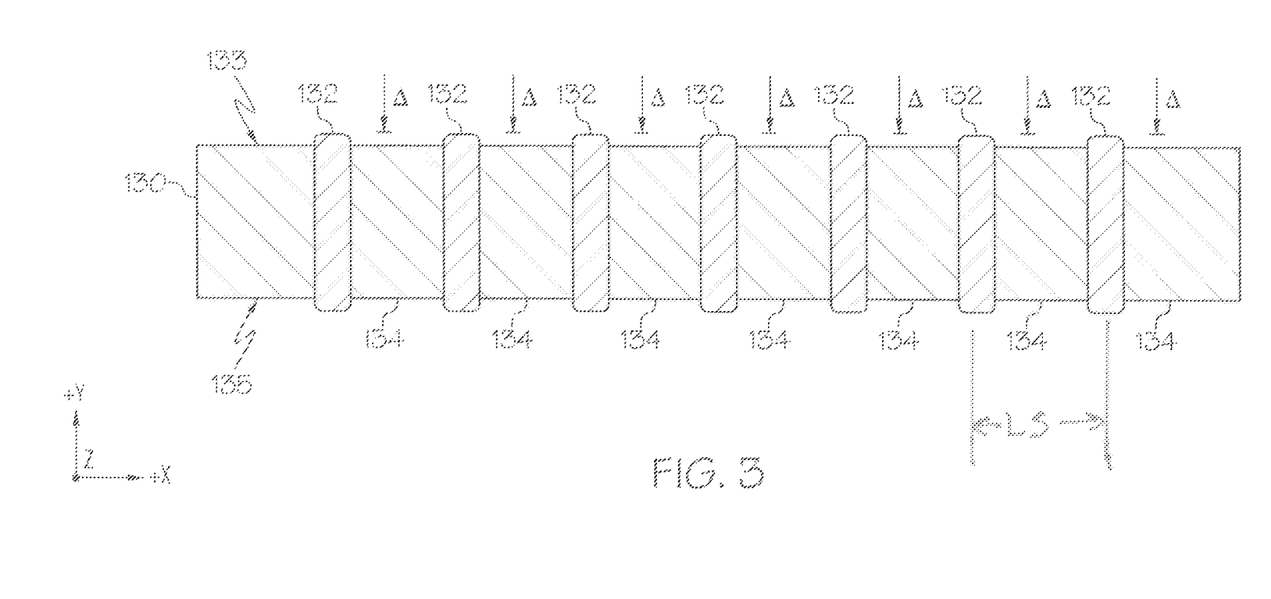
FIG. 5 schematically depicts a ferrule positioned adjacent to the photosensitive glass of FIG. 4, according to one or more embodiments shown and described herein.

Referring to FIG. 5, a ferrule 120 is positioned adjacent to the lower surface 135 of the photosensitive glass 130 opposite the anti-reflective coating 140. In embodiments, the lower surface 135 of the photosensitive glass 130 may be ground and/or polished such that the wafer-level lenses 132 include a fiber coupling end 32 that is generally level with the lower surface 135 of the photosensitive glass 130.

The ferrule 120 defines a plurality of apertures 122 extending through a thickness of the ferrule 120. Each of the plurality of apertures 122 corresponds to one of the individual wafer-level lenses 132. In embodiments, the ferrule 120 may be formed of a photosensitive glass, and the plurality of apertures 122 may be formed through photomachining process, such as a wet-etching process. In some embodiments, the ferrule 120 may be formed from the same material as the photosensitive glass 130. In these embodiments, the coefficient of thermal expansion (CTE) of the ferrule 120 and the photosensitive glass 130 may be substantially the same. By having the same CTE, the ferule 120 and the photosensitive glass 130, and accordingly the wafer-level lenses 132 may expand and contract in a similar manner in response to temperature fluctuations. In this way, movement of the ferrule 120 with respect to the photosensitive glass 130 and the wafer-level lenses 132 resulting from expansion and/or contraction may be minimized, and the ferrule 120 may remain aligned with the wafer-level lenses 132. In other embodiments, the ferrule 120 may be formed from a different material than the photosensitive glass 130.

Figure 6:
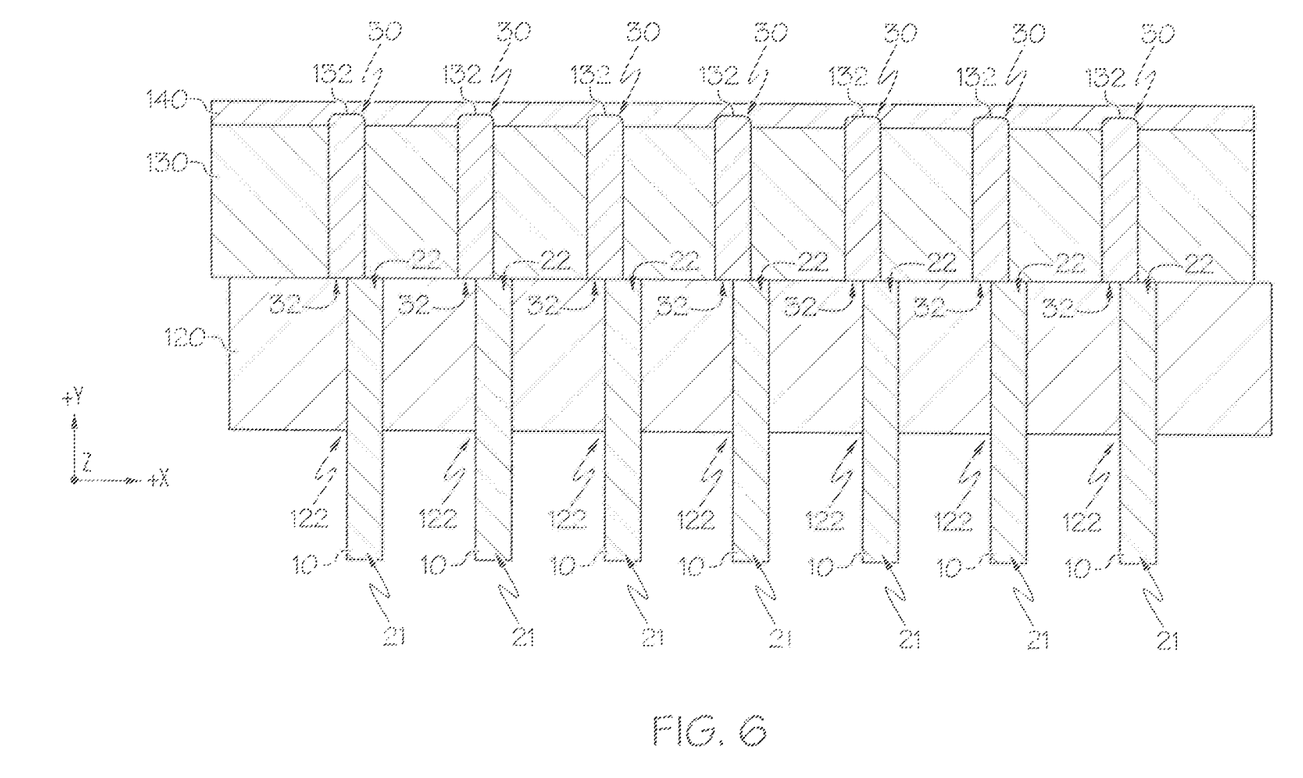
FIG. 6 schematically depicts optical fibers positioned within the ferrule of FIG. 5, according to one or more embodiments shown and described herein.

Referring to FIG. 6, a plurality of optical fibers 10 are positioned within the apertures 122 of the ferrule 120. Each of the optical fibers 10 may generally include a fiber end 21 and a lens end 22. The lens ends 22 of the optical fibers 10 may be positioned adjacent to the fiber coupling end 32 of the wafer-level lenses 132, and the fiber ends 20 of the optical fibers 10 are positioned distal from the wafer-level lenses 132. As depicted in FIG. 6, the apertures 122 of the ferrule 120 may not initially be aligned with corresponding wafer-level lenses 132. For example, in the configuration depicted in FIG. 6, the apertures 122 of the ferrule 120, and accordingly the optical fibers 10, are mis-aligned from the corresponding wafer-level lenses 132 in the x-direction. To assist in aligning the apertures 122 and the optical fibers 10 with the lenses 132, a light signal may be passed from the fiber ends 20 of the optical fibers 10 to the lens ends 22 of the optical fibers 10. The light signal may exit the lens ends 22 of the optical fibers 10 and pass through the wafer-level lenses 132. The transmission of light from the fiber ends 20 of the optical fibers 10 through the wafer-level lenses 132 may be detected. Without being bound by theory, misalignment between the optical fiber 10 and the wafer-level lenses 132 may result in optical loss (e.g., light transmitting and/or being absorbed by portions of the photosensitive glass 130 other than the wafer-level lenses 132). This optical loss may be determined based on the light signal initiated at the fiber end 20 of the optical fibers 10 and light output measured at the wafer-level lenses 132. By determining optical loss across the optical fibers 10 and the wafer-level lenses 132, alignment between the optical fibers 10 and the wafer-level lenses may be determined.

Figure 7:
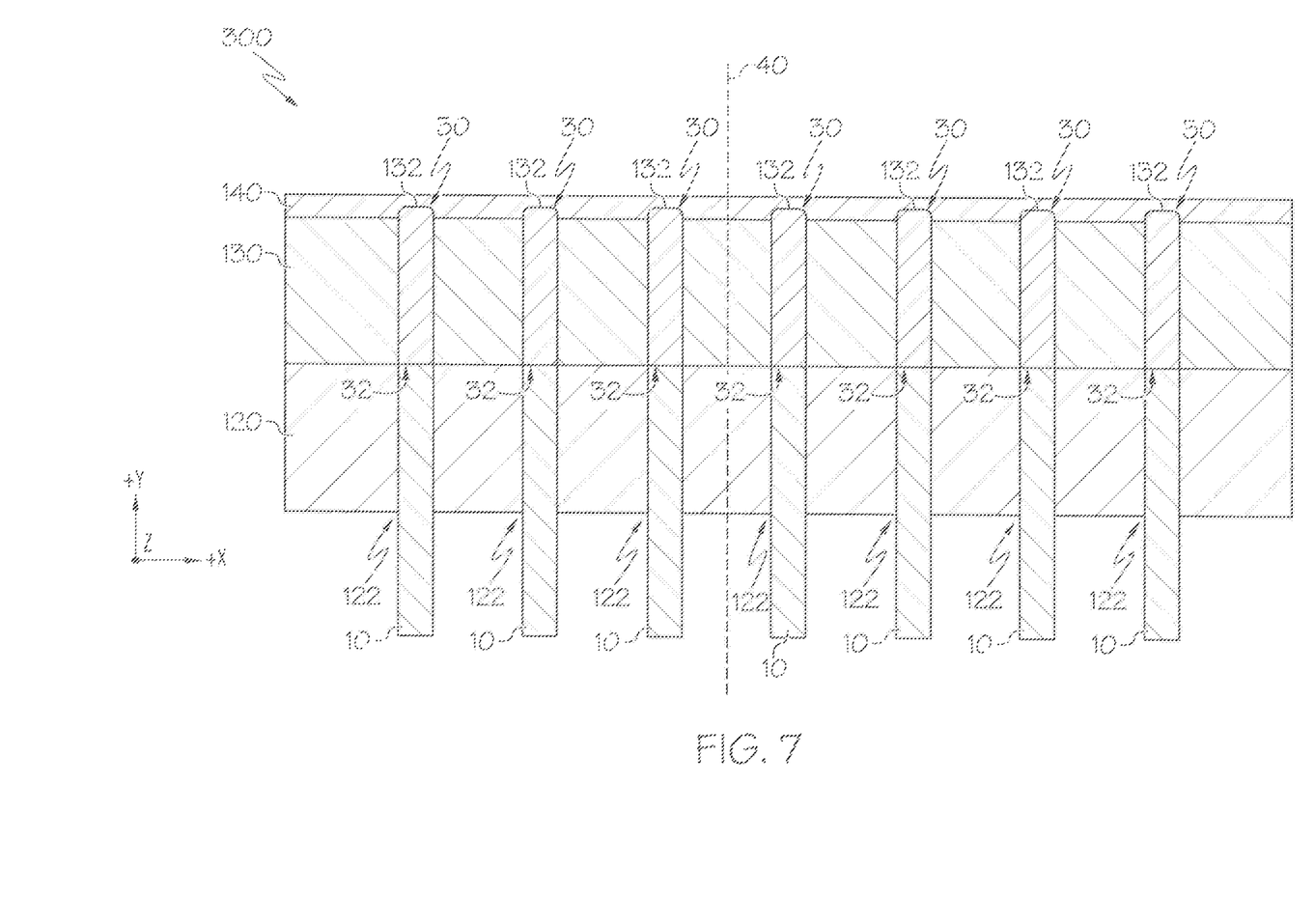
FIG. 7 schematically depicts the optical fibers aligned with the wafer-level lenses of FIG. 6, according to one or more embodiments shown and described herein.

Referring to FIG. 7, the ferrule 120 may be moved in the x-direction as depicted and/or the z-direction to align the apertures 122, and accordingly the optical fibers 10 with the corresponding wafer-level lenses 132. In embodiments, the ferule 120 may be moved with respect to the photosensitive glass 130 until less than 0.7 decibels (db) of optical loss is detected for light travelling through the optical fibers 10 and through the wafer-level lenses 132. In other embodiments, the ferule 120 may be moved with respect to the photosensitive glass until less than 0.5 db of optical loss is detected through the optical fibers 10 and the wafer-level lenses 132.

Upon aligning the apertures 122 of the ferrule 120, and accordingly the optical fibers 10, with the wafer-level lenses 132, the ferrule 120 may then be coupled to the photosensitive glass 130, such as by an adhesive, or the like, forming a wafer-level lens assembly 300. In embodiments, the wafer-level lenses 132 (and their associated optical fibers 10) may subsequently be diced into individual lens assemblies, as depicted in FIG. 2. For example, the wafer-level lens assembly 300 may be separated along a separation line 40 as depicted in FIG. 7, separating a first plurality of lenses and a second plurality of lenses. In other embodiments, each of the plurality of wafer-level lenses 132 may diced and separated into individual lenses. The wafer-level lenses 132 may be diced and separated into a lens assemblies including any suitable or desired number of lenses, such as assemblies including seventy-six lenses 132, thirty-six lenses 132, twenty-four lenses 132, or twelve lenses 132. The wafer-level lenses 132 may be diced to form assemblies including a desired number of lenses 132 to correspond to conventional fiber optic connectors, such that assemblies including lenses 132 according to the present disclosure may be optically coupled to existing fiber optic connectors formed through conventional processes.

TABLE 1 describes a non-limiting example composition of the photosensitive glass 130, with the various constituents listed in weight percent wt %:

TABLE 1

| | |
|---|---|
| $SiO_2$ | 65-85 |
| $Na_2O$ | 0-10 |
| $K_2O$ | 0-8 |
| $KNO_3$ | 0-5 |
| $Al_2O_3$ | 2-7 |
| ZnO | 0-5 |
| $Sb_2O_3$ | 0-5 |
| $CeO_2$ | 0.01-0.05 |
| $Li_2O$ | 8-11 |
| Au | 0-0.015* |
| Ag | 0-0.005** |
| $B_2O_3$ | 0-1 |

*If Au is Zero, then Ag is the sole photosenstive agent with a 0.0005-0.005 weight percent wt %.
**If Ag is zero, then Au is the sole photosenstive agent with a 0.005-0.015 weight percent wt %.

Tables 2A-2B list non-limiting, example silicate glass compositions which can be used to make the wafer-level lenses 132. Tables 2A-2B shows each of the compositions in parts by weight of the silicate glass, in addition to measured sag heights and various physical properties:

TABLE 2A

| | 1 | 2 | 3 | 4 | 5 | 6 | 7 |
|---|---|---|---|---|---|---|---|
| $SiO_2$ | 76.7 | 75.7 | 74.7 | 73.7 | 72.7 | 79.5 | 76.7 |
| $Na_2O$ | 4 | 5 | 6 | 7 | 8 | 1.6 | 2 |
| $K_2O$ | 3.8 | 3.8 | 3.8 | 3.8 | 3.8 | 4.2 | 5.8 |
| $KNO_3$ | 0 | 0 | 0 | 0 | 0 | 0 | 0 |
| $Al_2O_3$ | 4.8 | 4.8 | 4.8 | 4.8 | 4.8 | 4.2 | 4.8 |
| ZnO | 1 | 1 | 1 | 1 | 1 | 1 | 1 |
| Au | 0 | 0 | 0 | 0 | 0 | 0 | 0 |
| Ag | 0.0025 | 0.0025 | 0.0025 | 0.0025 | 0.0025 | 0.0025 | 0.0025 |
| $CeO_2$ | 0.02 | 0.02 | 0.02 | 0.02 | 0.02 | 0.02 | 0.02 |
| $Sb_2O_3$ | 0 | 0 | 0 | 0 | 0 | 0 | 0 |
| $Li_2O$ | 9.7 | 9.7 | 9.7 | 9.7 | 9.7 | 9.5 | 9.7 |

TABLE 2A-continued

| | 1 | 2 | 3 | 4 | 5 | 6 | 7 |
|---|---|---|---|---|---|---|---|
| SAG HEIGHTS: | | | | | | | |
| sag height (4 minute exposure to Hg/Xe radiation) | 43 μm | 47 μm | 47 μm | 68 μm | 71 μm | 17 μm | 36.8 μm |
| sag height (8 minute exposure to Hg/Xe radiation) | 35 μm | 52 μm | 37 μm | 69 μm | 89 μm | 27 μm | 45.1 μm |
| sag height (4 minute exposure to Hg/Xe rndiation and ion exchange step) | 100 μm | 106 μm | 105 μm | 125 μm | 154 μm | 53 μm | 86.6 μm |
| sag height (8 minute exposuret o Hg/Xe rndiation and ion exchange step) | 89 μm | 111 μm | 90 μm | 130 μm | 187 μm | 62 μm | 77.8 μm |
| PHYSICAL PROPERTIES: | | | | | | | |
| Softening Point | 617° C. | 602° C. | 596° C. | 586° C. | 578° C. | NA | NA |
| Annealing Point | 441° C. | 436° C. | 432° C. | 429° C. | 431° C. | NA | NA |
| Strain Point | 403° C. | 400° C. | 396° C. | 397° C. | 415° C. | NA | NA |
| Coefficient of Thermal Expansion (CTE) | 93.0° C. | 97.2° C. | 100° C. | 104.9° C. | 109.1° C. | NA | NA |
| Density (g/cm$^3$) | 2.380 | 2.392 | 2.398 | 2.406 | 2.415 | NA | NA |

TABLE 2B

| | 1 | 2 | 3 | 4 | 5 | 6 |
|---|---|---|---|---|---|---|
| $SiO_2$ | 74.7 | 78.7 | 74.7 | 76.7 | 76.7 | 76.7 |
| $Na_2O$ | 9.8 | 4 | 4 | 0 | 4 | 2 |
| $K_2O$ | 0 | 3.8 | 3.8 | 6.8 | 2.8 | 4.8 |
| $KNO_3$ | 0 | 0 | 0 | 1 | 1 | 1 |
| $Al_2O_3$ | 4.8 | 2.8 | 6.8 | 4.8 | 4.8 | 4.8 |
| ZnO | 1 | 1 | 1 | 1 | 1 | 1 |
| Au | 0 | 0 | 0 | .01 | 0 | .01 |
| Ag | .0025 | .0025 | .0025 | 0 | .0025 | 0 |
| $CeO_2$ | 0.02 | 0.02 | 0.02 | 0.02 | 0.02 | 0.02 |
| $Sb_2O_3$ | 0 | 0 | 0 | .2 | .2 | .2 |
| $Li_2O$ | 9.7 | 9.7 | 9.7 | 9.7 | 9.7 | 9.7 |
| SAG HEIGHTS: | | | | | | |
| sag height (4 minute exposure to Hg/Xe radiation) | 32.6 μm | 30.5 μm | 29.6 μm | 23.6 μm* | 27.0 μm | 31.9 μm* |
| sag height (8 minute exposure to Hg/Xe radiation) | 36.8 μm | 23.8 μm | 40.2 μm | 22.0 μm** | 22.0 μm | 79.5 μm** |
| sag height (4 minute exposure to Hg/Xe radiation and ion exchange step) | 87.7 μm | 86.3 μm | 80.2 μm | 55.2 μm* | 50.5 μm | 48.6 μm* |
| sag height (8 minute exposure to Hg/Xe radiation and ion exchange step) | 97.4 μm | 78.0 μm | 92.5 μm | 46.2 μm** | 46.2 μm | 113.7 μm** |
| Physical Properties: | | | | | | |
| Softening Point | 585° C. | | | | | |
| Annealing Point | 429° C. | | | | | |
| Strain Point | 394° C. | | | | | |
| Coefficient of Thermal Expansion (CTE) | 104.9° C. | | | | | |
| Density (g/cm$^3$) | 2.408 | | | | | |

*3 minute exposure to Hg/Xe radiation and heat treated at 615 C. for 1 hr in N.
**6 minute exposure to Hg/Xe radiation and heat treated at 615 C. for 1 hr in N.

In addition to the aforementioned silicate glass compositions listed in TABLES 1 and 2A-2B, it should be understood that there are other known or yet-to-be-developed photosensitized silicate glass compositions that may be used to make desirable wafer-level lenses 132.

Accordingly, it should be understood that wafer-level lenses are described herein for use in fiber optic connectors. The wafer-level lenses are formed on a photosensitive glass by selectively exposing portions of the photosensitive glass to electromagnetic energy and thermal energy. In embodiments, an anti-reflective coating may be applied to the wafer-level lenses to reduce Fresnel reflection, and reduce signal loss across the wafer-level lenses. By applying the anti-reflective coating to wafer-level lenses, the anti-reflective coating may be applied to multiple lenses simultaneously, improving the accuracy of the application and reducing manufacturing costs. A ferrule including a plurality of apertures for holding a plurality of optical fibers is coupled to the wafer-level lenses. The plurality of optical fibers may be aligned with the wafer-level lenses such that each of the optical fibers are aligned with a corresponding wafer-level lens simultaneously, further reducing manufacturing costs. The wafer-level lenses may then be diced into assemblies including any desired number of lenses. Furthermore in some embodiments, the ferrule and the wafer-level lenses may include the same material, such that the ferrule and the wafer-level lenses have the same CTE and expand and contract similarly to fluctuations in temperature. By expanding and contracting in a similar manner in response to temperature fluctuations, the ferrule and the wafer-level lenses may remain aligned when exposed to temperature fluctuations.

What is claimed is:

1. A method for forming lenses for a fiber optic connector, the method comprising:
    forming a mask on a photosensitive glass, the mask defining a plurality of covered portions of the photosensitive glass and a plurality of open portions of the photosensitive glass that are positioned between the plurality of covered portions, wherein a spacing of the covered portions on the mask comprise a larger spacing than a desired lens spacing;
    exposing the photosensitive glass and the mask to electromagnetic energy;
    removing the mask from the photosensitive glass;
    forming wafer-level lenses at the plurality of covered portions of the photosensitive glass by exposing the photosensitive glass to thermal energy, wherein the wafer-level lenses being formed at a lens-spacing within 0.3 micrometers or less of the desired lens spacing; and
    applying an anti-reflective coating to an upper surface of the photosensitive glass.

2. The method of claim 1, further comprising dicing the wafer-level lenses into a first plurality of lenses and a second plurality of lenses.

3. The method of claim 1, further comprising coupling a ferrule to a lower surface of the photosensitive glass opposite the upper surface, the ferrule comprising a plurality of apertures corresponding to the wafer-level lenses.

4. The method of claim 3, further comprising inserting a plurality of optical fibers into the plurality of apertures of the ferrule, and optically coupling the plurality of optical fibers to the wafer-level lenses.

5. The method of claim 3, wherein the ferrule comprises a photosensitive glass and the method further comprising photomachining the plurality of apertures in the ferrule.

6. The method of claim 3, wherein the ferrule and the photosensitive glass comprise the same material.

7. The method of claim 1, wherein the wafer-level lenses being formed at a lens-spacing within 0.1 micrometers or less of the desired lens spacing.

8. A method for aligning a ferrule with wafer-level lenses, the method comprising:
    forming a mask on a photosensitive glass, the mask defining a plurality of covered portions of the photosensitive glass, and a plurality of open portions of the photosensitive glass positioned between the plurality of covered portions, wherein a spacing of the plurality of covered portions on the mask comprise a larger spacing than a desired lens spacing;
    exposing the photosensitive glass and the mask to electromagnetic energy;
    removing the mask from the photosensitive glass;
    forming wafer-level lenses at the plurality of covered portions of the photosensitive glass by exposing the photosensitive glass to thermal energy;
    positioning the ferrule adjacent to the wafer-level lenses, the ferrule comprising a plurality of apertures corresponding to the wafer-level lenses;
    passing a light signal through the plurality of apertures in the ferrule and the wafer-level lenses;
    detecting a light output through the wafer-level lenses; and
    moving the ferrule based on the detected light output through the wafer-level lenses so that the wafer-level lenses are formed at a lens-spacing within 0.3 micrometers or less of a desired spacing.

9. The method of claim 8, further comprising moving the ferrule until the detected light output indicates less than 0.5 decibel optical loss through each of the wafer-level lenses.

10. The method of claim 9, further comprising coupling the ferrule to the wafer-level lenses to form a wafer-level lens assembly.

11. The method of claim 10, further comprising dicing the wafer-level lens assembly into a first plurality of lenses and a second plurality of lenses.

12. The method of claim 8, further comprising applying an anti-reflective coating to the wafer-level lenses.

13. The method of claim 8, further comprising inserting a plurality of optical fibers into the plurality of apertures of the ferrule and optically coupling the plurality of optical fibers to the wafer-level lenses.

14. The method of claim 8, wherein the ferrule and the photosensitive glass comprise the same material.

15. The method of claim 14, further comprising photomachining the plurality of apertures in the ferrule.

16. The method of claim 8, wherein the wafer-level lenses being formed at a lens-spacing within 0.1 micrometers or less of the desired lens spacing.

17. A wafer-level lens assembly comprising:
    a ferrule comprising a plurality of apertures extending through a thickness of the ferrule;
    a plurality of optical fibers positioned in and extending through the plurality of apertures of the ferrule; and
    a photosensitive glass comprising wafer-level lenses optically coupled to the plurality of optical fibers, wherein the photosensitive glass comprises high-density portions positioned outside of the wafer-level lenses, the high-density portions comprising a density that is greater than a density of the wafer-level lenses, wherein the coefficient of thermal expansion of the ferrule and the photosensitive glass are substantially the same.

18. The wafer-level lens assembly of claim 17, wherein the wafer-level lenses comprise a fiber end facing the plurality of optical fibers, and a lens end opposite the fiber end, the wafer-level lens assembly further comprising an anti-reflective coating positioned on the lens end of the wafer-level lenses.

19. The wafer-level lens assembly of claim 17, wherein the ferrule comprises a photosensitive glass.

20. The wafer-level lens assembly of claim 19, wherein the ferrule and the wafer-level lenses comprise the same material.

21. The wafer-level lens assembly of claim 17, wherein the plurality of optical fibers are each aligned with a corresponding wafer-level lens such that there is less than 0.5 decibel optical loss from the plurality of optical fibers across the wafer-level lenses.

22. The wafer-level lens assembly of claim 17, wherein the photosensitive glass comprises at least twelve wafer-level lenses.

* * * * *

UNITED STATES PATENT AND TRADEMARK OFFICE
CERTIFICATE OF CORRECTION

PATENT NO. : 10,866,367 B2
APPLICATION NO. : 16/506121
DATED : December 15, 2020
INVENTOR(S) : Nicholas Francis Borrelli et al.

It is certified that error appears in the above-identified patent and that said Letters Patent is hereby corrected as shown below:

On the Title Page

Item (73), Assignee, Line 2, delete "Coming," and insert -- Corning, --, therefor.

On page 2, in Column 1, item (56), Other Publications, Line 7, delete "82670O" and insert -- 826700 --, therefor.

Signed and Sealed this
Eleventh Day of May, 2021

Drew Hirshfeld
*Performing the Functions and Duties of the
Under Secretary of Commerce for Intellectual Property and
Director of the United States Patent and Trademark Office*